United States Patent
Uto et al.

(10) Patent No.: US 7,248,690 B2
(45) Date of Patent: Jul. 24, 2007

(54) VOICE SIGNAL CLIPPING CIRCUIT AND TELEPHONE SET THEREWITH

(75) Inventors: Yoshihiro Uto, Akishima (JP); Toshiaki Takahashi, Hino (JP); Takeshi Horiuchi, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 10/948,642

(22) Filed: Sep. 24, 2004

(65) Prior Publication Data

US 2005/0094801 A1    May 5, 2005

(30) Foreign Application Priority Data

Sep. 29, 2003    (JP) ............................. 2003-337751

(51) Int. Cl.
*H04M 1/00* (2006.01)
*H04M 9/00* (2006.01)

(52) U.S. Cl. ................. 379/390.01; 379/395; 381/94.8

(58) Field of Classification Search ........... 379/390.01, 379/388.01–390.04, 395; 381/94.8, 107–108; 455/114.2
See application file for complete search history.

(56) References Cited

U.S. PATENT DOCUMENTS

| | | | | |
|---|---|---|---|---|
| 5,631,969 | A | * | 5/1997 | Hanson ...................... 381/107 |
| 5,966,438 | A | * | 10/1999 | Romesburg ............ 379/406.01 |
| 6,195,029 | B1 | * | 2/2001 | Urry et al. .................. 341/138 |
| 6,266,423 | B1 | | 7/2001 | Werrbach |

FOREIGN PATENT DOCUMENTS

| | | |
|---|---|---|
| JP | 5-183622 | 7/1993 |
| JP | 11-284715 | 10/1999 |
| JP | 2002-218045 | 8/2002 |

OTHER PUBLICATIONS

Rabiner et al, "Digital Processing of Speech Signals", 1978, Prentice-hall, pp. 150-158.*

* cited by examiner

*Primary Examiner*—Ramnandan Singh
(74) *Attorney, Agent, or Firm*—Finnegan, Henderson, Farabow, Garrett & Dunner, L.L.P.

(57) ABSTRACT

A voice signal clipping circuit comprising, an amplifier which amplifies an input voice signal to a permissible level and a clipper which clips an amplitude component in excess of the permissible level from an output signal from the amplifier.

12 Claims, 6 Drawing Sheets

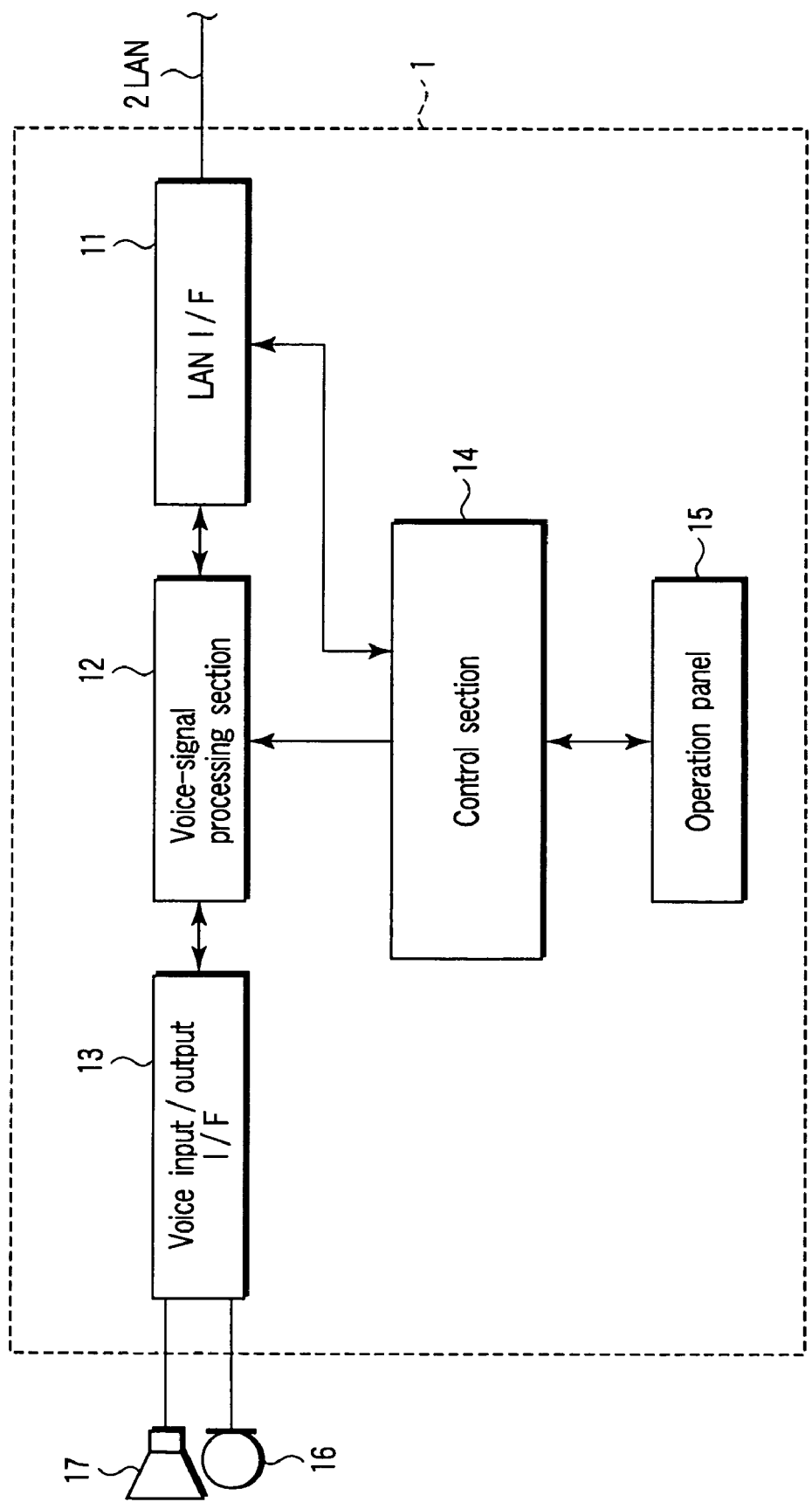
F I G. 1

VOICE SIGNAL CLIPPING CIRCUIT AND TELEPHONE SET THEREWITH

CROSS-REFERENCE TO RELATED APPLICATIONS

This application is based upon and claims the benefit of priority from prior Japanese Patent Application No. 2003-337751, filed Sep. 29, 2003, the entire contents of which are incorporated herein by reference.

BACKGROUND OF THE INVENTION

1. Field of the Invention

The present invention relates to a voice signal clipping circuit that clips excessive amplitude of an input voice signal, and a telephone set having the voice signal clipping circuit.

2. Description of the Related Art

Conventionally, telephone exchanges such as a private branch exchange (PBX) and a key telephone system are used in many cases in office buildings and business offices. These kinds of telephone exchanges include telephone sets as extension terminals for example, and perform exchanges between the extension terminals and external communication networks like public networks and between the extension terminals to establish communications.

Some telephone sets have volume adjusting circuits to obtain proper reception volume. However, when the volume is increased, a noise component mixed in the voice signal is also amplified, which may make it difficult to catch voice.

To overcome this difficulty, a unit that clips excessive amplitude of the voice signal amplified by the volume adjusting circuit and reduces the amplitude set in the volume adjusting circuit in response to the clipping operation is proposed (refer to Jpn. Pat. Appln. KOKAI Publication No. 5-183622).

Some telephone exchanges are connected with analog telephone sets, digital telephone sets, and IP telephone sets that are not provided with the volume adjusting circuit, in addition to the telephone sets having the volume adjusting circuit. When voice signals of a level larger than a rated input is input to large-scale integrated circuits (LSI) of these telephone sets that process the voice signal, the other communication parties receive a distorted voice. Therefore, it is strongly desired to take measures to prevent the distortion of a voice in the telephone set that do not have the volume adjusting circuit even if a voice signal larger than the rated input is input to the LSI.

BRIEF SUMMARY OF THE INVENTION

It is an object of the present invention to provide a voice signal clipping circuit capable of performing proper voice communications with high communication quality without an influence of a signal level of an input voice signal, and a telephone set having this voice signal clipping circuit.

According to an aspect of the present invention, there is provided a voice signal clipping circuit comprising: an amplifier which amplifies an input voice signal to a permissible level; and a clipper which clips an amplitude component in excess of the permissible level from an output signal from the amplifier.

According to another aspect of the present invention, there is provided a telephone set comprising: an amplifier which amplifies an input voice signal to a permissible level; and a clipper which clips an amplitude component in excess of the permissible level from an output signal from the amplifier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a primary configuration of an IP telephone set in which a voice signal clipping circuit according to the present invention is used.

DETAILED DESCRIPTION OF THE INVENTION

Figure 2:
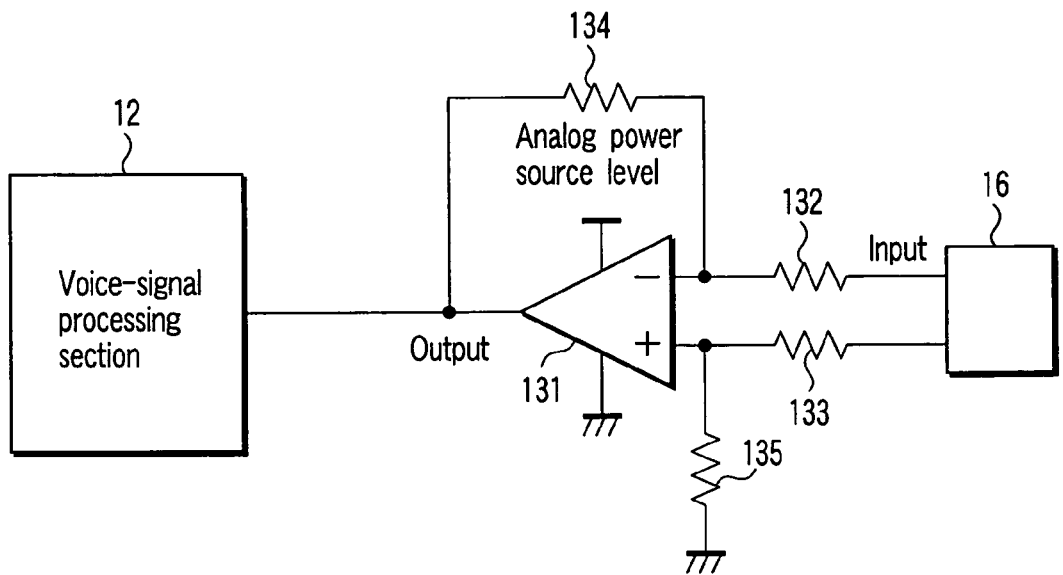
FIG. 2 is a circuit diagram of a primary configuration of a voice signal clipping circuit according to a first embodiment of the present invention.

The embodiments of the present invention will be explained in detail below with reference to the drawings.

FIG. 1 is a block diagram of a network telephone set (i.e., IP telephone set) according to the present invention.

In FIG. 1, a reference numeral 1 denotes an IP telephone set, including a local area network (LAN) interface section 11 (hereinafter referred to as a LAN I/F 11), a voice signal processing section 12 (hereinafter referred to as a processing section 12), a voice input/output interface section 13 (hereinafter referred to as a voice input/output I/F 13), a control section 14, and an operation panel 15.

The LAN I/F 11 carries out an interface operation concerning a LAN 2. In other words, the LAN I/F 11 extracts a voice packet and control data from a transmission packet sent from the LAN 2. The LAN I/F 11 gives the voice packet to the processing section 12, and gives the control data to the control section 14. The LAN I/F 11 also multiplexes data given from the control section 14 to a voice packet given from the processing section 12, and sends the multiplied result to the LAN 2.

The processing section 12 converts the voice packet given from the LAN I/F 11 into an analog reception voice signal, and gives the analog reception voice signal to the voice input/output I/F 13. The processing section 12 converts a transmission voice signal input from the voice input/output I/F 13 into a voice packet that can be handled by the LAN 2, and gives the voice signal to the LAN I/F 11.

A microphone 16 and a speaker 17 are connected to the voice input/output I/F 13. The voice input/output I/F 13 inputs a transmission voice signal input from the microphone 16, to the voice signal processing section 12. The voice input/output I/F 13 outputs a reception voice signal output from the processing section 12, to the speaker 17 in an enlarged voice.

The control section 14 controls each section of the IP telephone set 1 and carries out a communication processing with a telephone exchange (not shown) via the LAN 2, by software processing.

The operation panel 15 has a key switch, an LCD, etc. The operation panel 15 receives input of various instructions to the control section 14 from a user, and gives various kinds of information to the user.

FIRST EMBODIMENT

The first embodiment relates to the processing section 12 and the voice input/output I/F 13 in FIG. 1. The voice input/output I/F 13 includes the voice signal clipping circuit according to the present invention.

FIG. 2 is a circuit diagram of a primary configuration of the voice input/output I/F 13 according to the first embodiment.

The voice input/output I/F 13 includes an operational amplifier 131, and resistors 132, 133, 134, and 135. The resistor 132 lies in a signal line between the microphone 16 and a minus terminal of the operational amplifier 131. The resistor 133 lies in a signal line between the microphone 16 and a plus terminal of the operational amplifier 131.

The resistor 134 connects between the minus terminal of the operational amplifier 131 and an output terminal of the operational amplifier 131. The resistor 135 connects between the minus terminal of the operational amplifier 131 and a reference potential point.

The operational amplifier 131 amplifies a voice signal input from the microphone 16 via the resistors 132 and 133, at predetermined amplification factors. The amplification factors are set according to resistances of the resistors 132, 133, 134, and 135.

The operation of the circuit having the above configuration will be explained next.

Assume that the power source of the operational amplifier 131 is used at a ground level (0 V) and an analog power source level (+5 V). The operational amplifier 131 directly amplifies and outputs a voice signal of a small input level. However, the operational amplifier 131 amplifies a voice signal of a large input level, and clips the amplitudes of the voice signal larger than a value of the higher limit and smaller than a value of the lower limit. The value of the higher limit is set to a value close to the analog power source level, and the value of the lower limit is set to a value close to the ground level.

Figure 3A:
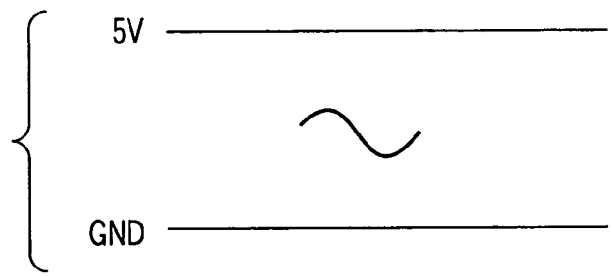
FIGS. 3A and 3B are signal waveform diagrams showing a state that an operational amplifier clips a voice signal according to the first embodiment.
Figure 3B:
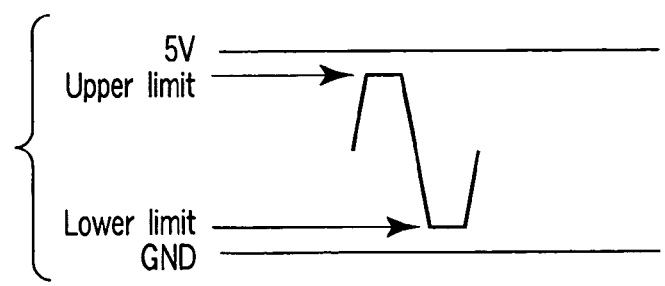

In other words, the operational amplifier 131 amplifies the voice signal up to a range between the value of the higher limit and the value of the lower limit, that is, a permissible level. In this case, a voice signal of a sinusoidal wave shown in FIG. 3A is clipped at a crest portion larger than the value of the higher limit and at a crest portion smaller than the value of the lower limit. As a result, the voice signal is output in a shape of a rectangular wave as shown in FIG. 3B.

Figure 4A:
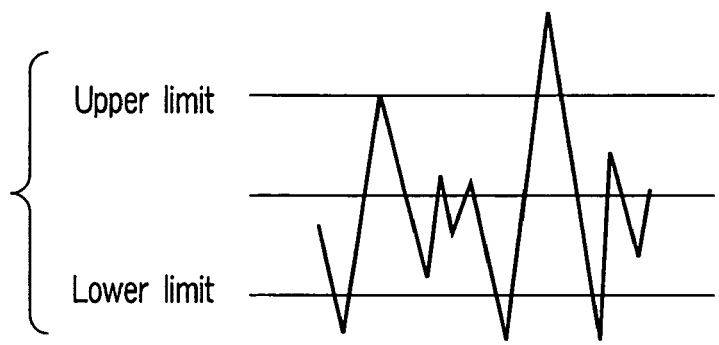
FIGS. 4A and 4B are signal waveform diagrams showing a state that an operational amplifier clips a voice signal according to the first embodiment.
Figure 4B:
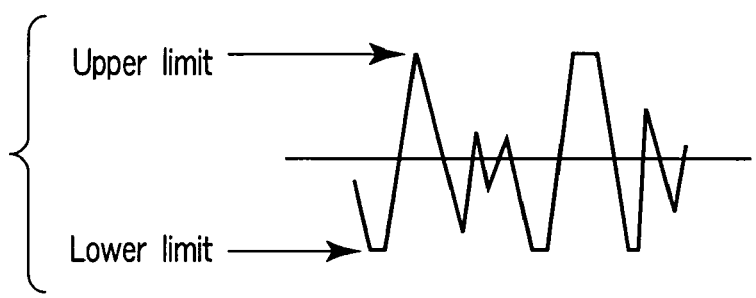

Further, the voice signal has a characteristic of a temporally high peak as shown in FIG. 4A. When the voice signal is passed through the operational amplifier 131, the voice signal has a waveform with the value of the higher limit and the value of the lower limit cut out as shown in FIG. 4B. Even after the waveform is cut at the value of the higher limit and the value of the lower limit, the quality of voice is substantially retained.

When the voice signal from the microphone 16 is input to the processing section 12, the amplification factor of the operational amplifier 131 needs to be at a certain high level to avoid poor quality of voice.

As explained above, in the first embodiment of the present invention, the operational amplifier 131 that amplifies the voice signal to an input rated level of the processing section 12 is used as follows. The operational amplifier 131 amplifies the voice signal input from the microphone 16 to a permissible level. The operational amplifier 131 cuts out the amplitude components larger than the value of the higher limit and smaller than the value of the lower limit, that is, clips noise components. The operational amplifier 131 inputs the resultant voice signal to the processing section 12. Therefore, when a person talks in a large voice, side tones of the listener and the talker are not distorted. As a result, voice communications with high communication quality can be provided.

SECOND EMBODIMENT

The second embodiment relates to the processing section 12 and the voice input/output I/F 13 in FIG. 1.

Figure 5:
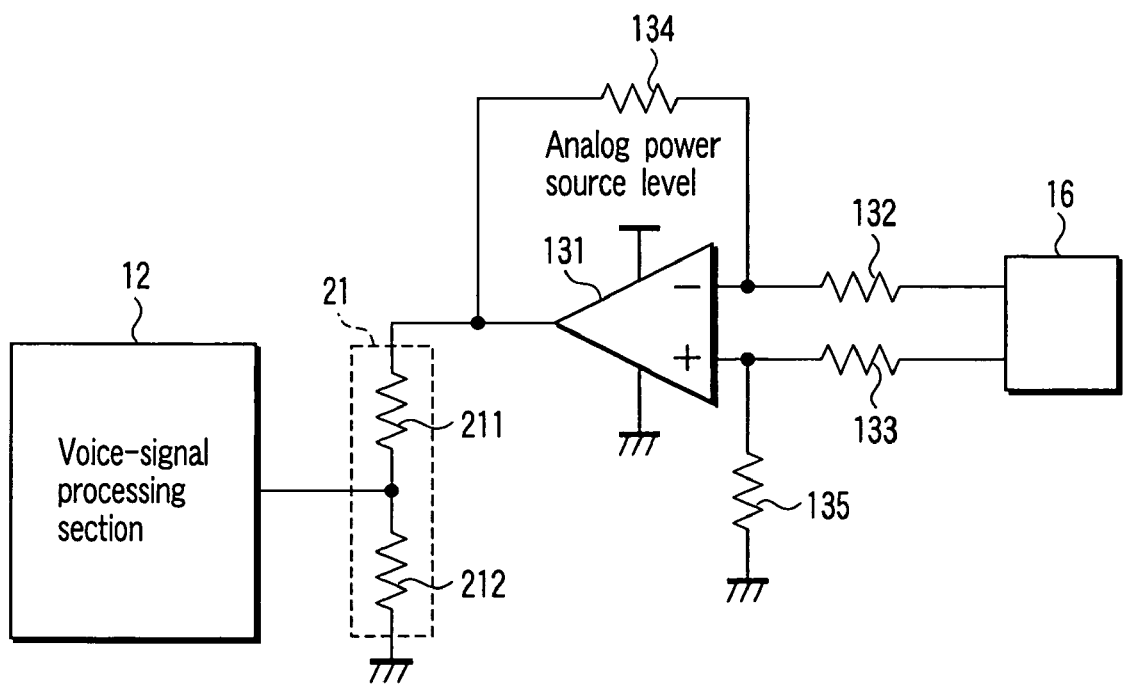
FIG. 5 is a circuit diagram of a primary configuration of a voice signal clipping circuit according to a second embodiment of the present invention.

FIG. 5 is a circuit diagram of a primary configuration of the voice input/output I/F 13 according to the second embodiment. In FIG. 5, parts same as those in FIG. 2 are designated with like reference numerals, and their detailed explanation will be omitted.

In the second embodiment, a voltage dividing circuit 21 is provided at an output side of the operational amplifier 131. The voltage dividing circuit 21 has resistors 211 and 212. The resistor 211 lies in a signal line between the operational amplifier 131 and the processing section 12. The resistor 212 connects between an output terminal of the resistor 211 and a reference potential point.

The voltage dividing circuit 21 receives an output voltage of the operational amplifier 131, and supplies an output of the divided voltage to the processing section 12. Then, a voice signal lower than the input rated level is input to the processing section 12.

As explained above, in the second embodiment, when the amplification level of the operational amplifier 131 is larger than the input rated level of the processing section 12, the operational amplifier 131 clips the amplitudes larger than a value of the higher limit and smaller than a value of the lower limit from the amplified signal. Then, the voltage dividing circuit 21 converts the amplified signal into a signal of the input rated level of the processing section 12. Therefore, the operational amplifier 131 does not need to be replaced with another operational amplifier to match with the input rated level of the processing section 12. As a result, voice communications with high communication quality can be provided in a simple structure having the voltage dividing circuit 21. Further, cost can be reduced.

THIRD EMBODIMENT

The third embodiment relates to the processing section 12 and the voice input/output I/F 13 in FIG. 1.

Figure 6:
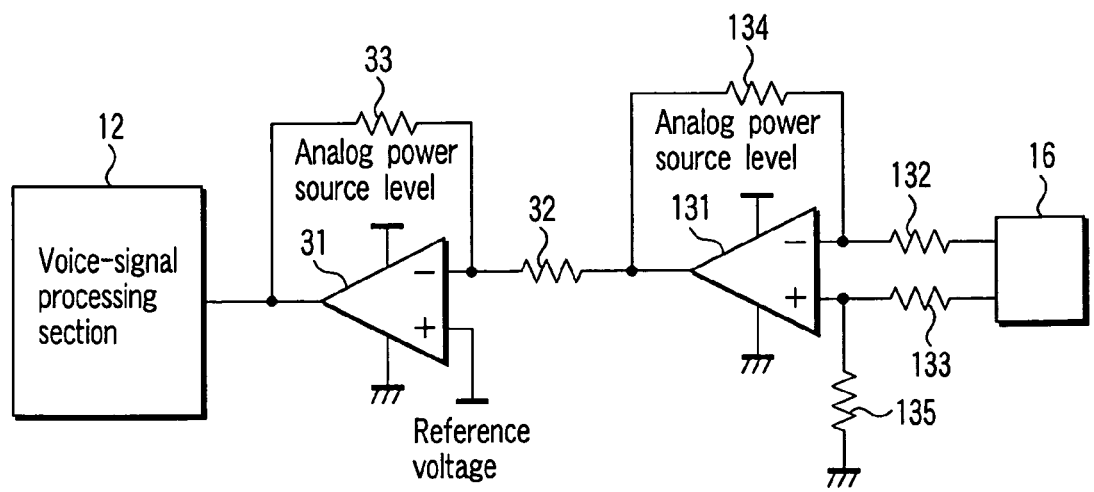
FIG. 6 is a circuit diagram of a primary configuration of a voice signal clipping circuit according to a third embodiment of the present invention.

FIG. 6 is a circuit diagram of a primary configuration of the voice input/output I/F 13 according to the third embodiment. In FIG. 6, parts same as those in FIG. 2 are designated with like reference numerals, and their detailed explanation will be omitted.

In the third embodiment, an operational amplifier 31 and resistors 32 and 33 are provided at the latter stage of the operational amplifier 131. The resistor 32 lies in a signal line between a minus terminal of the operational amplifier 31 and an output terminal of the operational amplifier 131. The resistor 33 connects between the minus terminal of the operational amplifier 31 and an output terminal of the operational amplifier 31. A reference voltage is supplied to a plus terminal of the operational amplifier 31.

The operational amplifier 31 amplifies an output signal from the operational amplifier 131 at predetermined amplification factors. The amplification factors are set to less than 1 according to resistances of the resistors 32 and 33.

An output signal from the operational amplifier 31 is supplied to the processing section 12. A voice signal that is matched with the input rated level by the operational amplifier 31 is input to the processing section 12.

As explained above, in the third embodiment, when the amplification level of the operational amplifier 131 is larger than the input rated level of the processing section 12, the operational amplifier 131 clips the amplitudes larger than a value of the higher limit and smaller than a value of the lower limit from the amplified signal. Then, the operational amplifier 31 attenuates the amplified signal into a signal lower than the input rated level of the processing section 12. Therefore, the operational amplifier 131 does not need to be replaced with another operational amplifier to match with the input rated level of the processing section 12. As a result, voice communications with high communication quality can be provided. When the input impedance of the processing section 12 is low, only the amplification factors of the operational amplifier 31 need to be adjusted for utilization.

FOURTH EMBODIMENT

The fourth embodiment relates to the voice input/output I/F 13 in FIG. 1.

Figure 7:
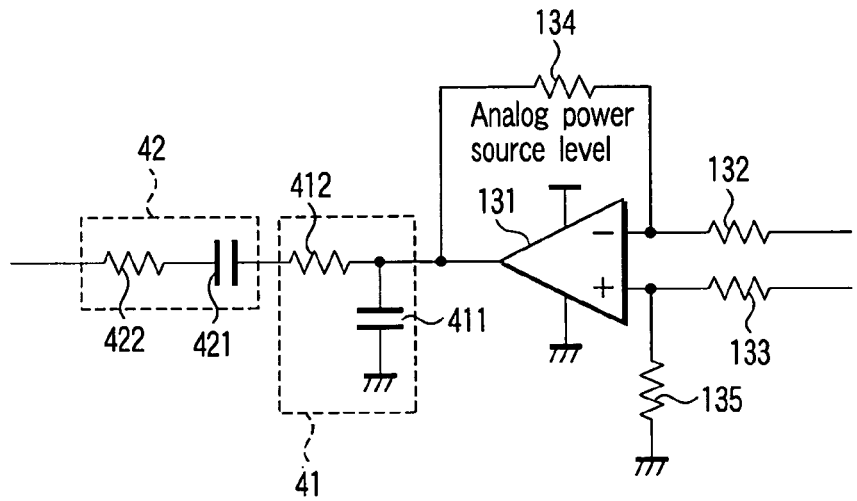
FIG. 7 is a circuit diagram of a primary configuration of a voice signal clipping circuit according to a fourth embodiment of the present invention.

FIG. 7 is a circuit diagram of a primary configuration of the voice input/output I/F 13 according to the fourth embodiment. In FIG. 7, parts same as those in FIG. 2 are designated with like reference numerals, and their detailed explanation will be omitted.

In the fourth embodiment, the operational amplifier 131 has a high-cut filter 41 and a low-cut filter 42. The high-cut filter 41 has a capacitor 411 and a resistor 412. The capacitor 411 connects between an output terminal of the operational amplifier 131 and a reference potential point. The resistor 412 lies in a signal line between the operational amplifier 131 and the processing section 12. An output current from the operational amplifier 131 is supplied to the low-cut filter 42 via the resistor 412, and is also accumulated in the capacitor 411. The capacitor 411 supplies the accumulated current to the processing section 12 via the low-cut filter 42, thereby removing the high-frequency component of an amplified signal in the operational amplifier 131.

The low-cut filter 42 has a capacitor 421 and a resistor 422. The capacitor 421 and the resistor 422 lie in a signal line between the operational amplifier 131 and the processing section 12. An output current from the high-cut filter 41 is accumulated in the capacitor 421, and is supplied to the processing section 12 via the resistor 422. As a result, a signal being removed a low-frequency component is supplied to the processing section 12.

The operation of the circuit having the above structure will be explained.

Figure 8A:
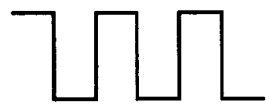
FIGS. 8A and 8B are signal waveform diagrams showing a state that a high component and a low component of a clipped voice signal are cut according to the fourth embodiment of the present invention.

A voice signal input to the operational amplifier 131 is output in the form of a rectangular wave, as shown in FIG. 8A. In this state, the voice signal includes too much higher harmonic, and gives poor acoustic-tone from the viewpoint of sound quality. When the voice signal includes DC component, noise occurs.

Figure 8B:

In the fourth embodiment, the output signal from the operational amplifier 131 is supplied to the processing section 12 via the high-cut filter 41 and the low-cut filter 42. As a result, a smooth signal is obtained, as shown in FIG. 8B. An analog line usually has a band of 300 Hz to 3.4 kHz. Therefore, the signal components lower than 300 Hz and higher than 3.4 kHz are removed by the high-cut filter 41 and the low-cut filter 42.

As explained above, according to the fourth embodiment, the provision of the high-cut filter 41 and the low-cut filter 42 makes it possible to remove the higher harmonic and noise from the voice signal clipped by the operational amplifier 131. As a result, sound quality can be improved.

FIFTH EMBODIMENT

The fifth embodiment relates to the processing section 12 and the voice input/output I/F 13 in FIG. 1.

Figure 9:
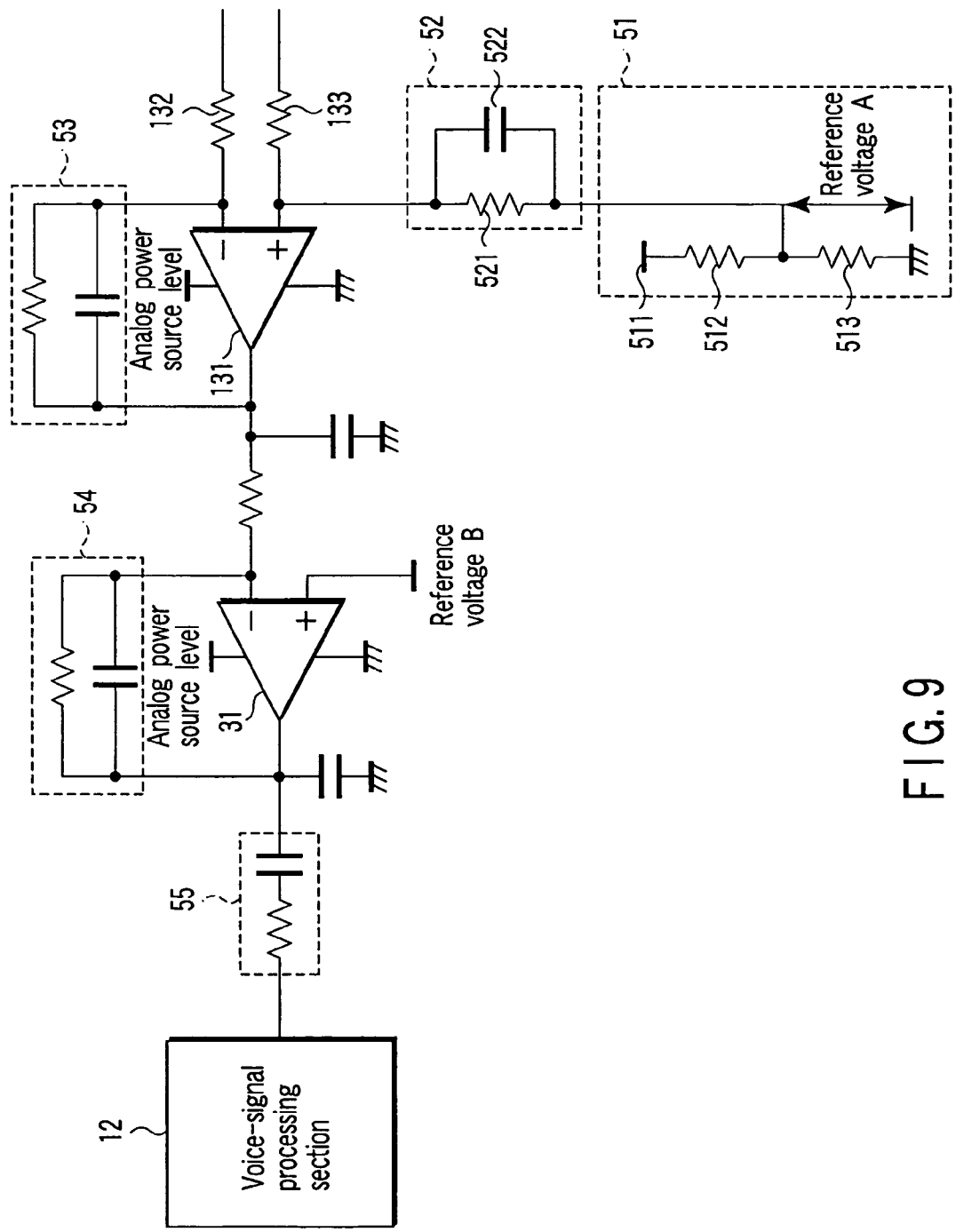
FIG. 9 is a circuit diagram of a primary configuration of a voice signal clipping circuit according to a fifth embodiment of the present invention.

FIG. 9 is a circuit diagram of a primary configuration of the voice input/output I/F 13 according to the fifth embodiment. In FIG. 9, parts same as those in FIG. 6 are designated with like reference numerals, and their detailed explanation will be omitted.

In the fifth embodiment, a correcting circuit 51 and a high-cut filter 52 are provided in the operational amplifier 131. The correcting circuit 51 includes a terminal 511, and resistors 512 and 513. The resistor 512 lies in a signal line between the terminal 511 and the plus terminal of the operational amplifier 131. The resistor 513 connects between an output terminal of the resistor 512 and a reference potential point. A reference voltage A is always supplied to the resistor 513.

When a reference voltage B of the operational amplifier 31 is supplied to the terminal 511, the correcting circuit 51 supplies a voltage dividing output corresponding to a difference between the reference voltage A and the reference voltage B, to the high-cut filter 52. The high-cut filter 52 connects a resistor 521 and a capacitor 522 in parallel. An output current from the correcting circuit 51 is supplied to the plus terminal of the operational amplifier 131 via the resistor 521, and is also accumulated in the capacitor 522. The capacitor 522 supplies the accumulated current to the plus terminal of the operational amplifier 131, thereby cutting the AC component from the output voltage from the correcting circuit 51. In other words, the reference voltage A of the operational amplifier 131 is corrected by the output voltage from the correcting circuit 51 so as to approximately coincide with the reference voltage B of the operational amplifier 31.

A high-cut filter 53 is provided in the operational amplifier 131. A high-cut filter 54 and a low-cut filter 55 are provided in the operational amplifier 31. With this arrangement, the voice signal input to the processing section 12 can be made smooth.

As explained above, according to the fifth embodiment, the operational amplifier 131 has the correcting circuit 51 that corrects the difference between the reference voltage A of the operational amplifier 131 and the reference voltage B of the operational amplifier 31. Therefore, high-quality voice communications can be provided by effectively using the dynamic range of the analog amplifier circuit, for example.

SIXTH EMBODIMENT

The sixth embodiment relates to the processing section 12 and the voice input/output I/F 13 in FIG. 1.

Figure 10:
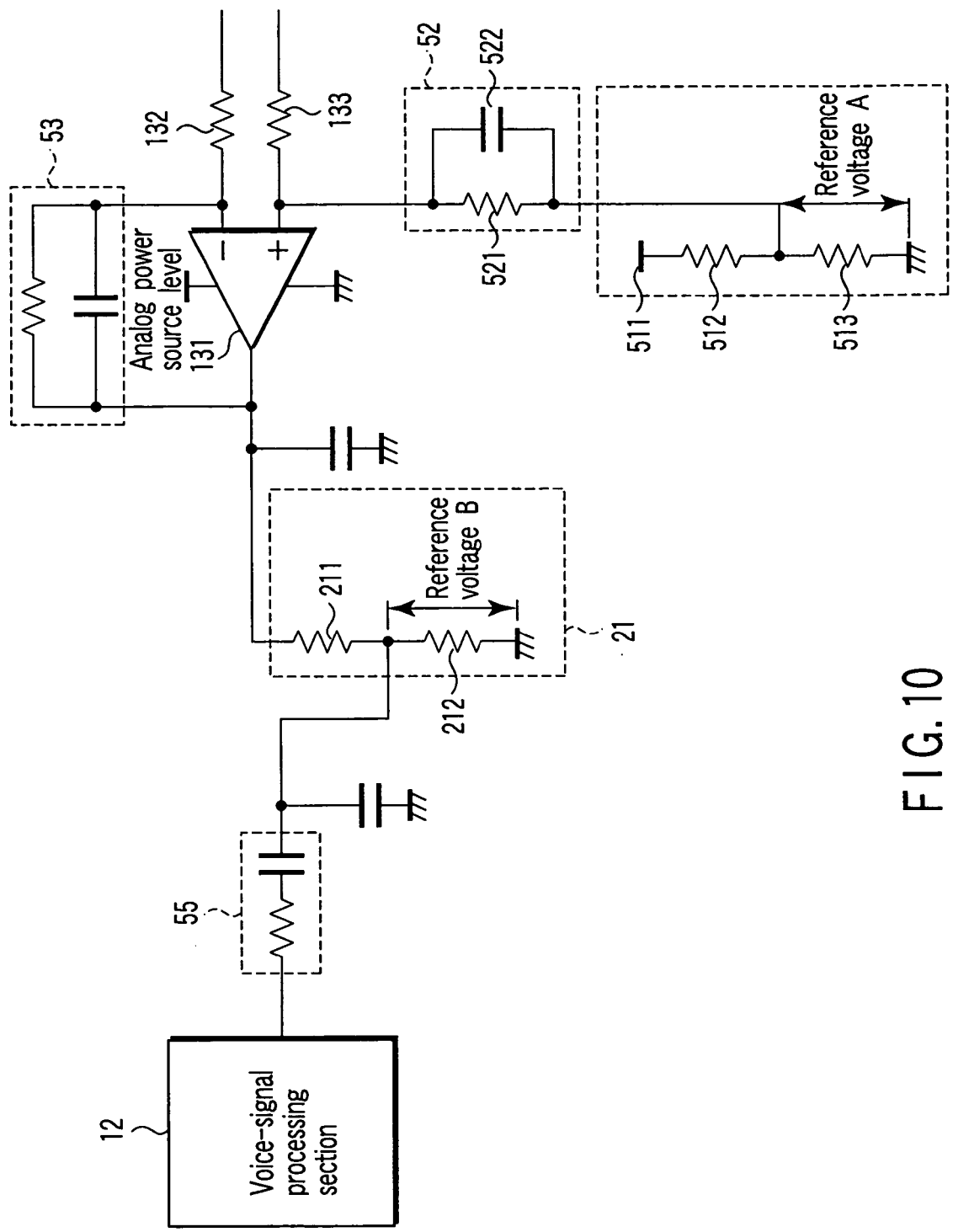
FIG. 10 is a circuit diagram of a primary configuration of a voice signal clipping circuit according to a sixth embodiment of the present invention.

FIG. 10 is a circuit diagram of a primary configuration of the voice input/output I/F 13 according to the sixth embodiment. In FIG. 10, parts same as those in FIG. 5 and FIG. 9 are designated with like reference numerals, and their detailed explanation will be omitted.

In the sixth embodiment, the operational amplifier 131 has the correcting circuit 51 and the high-cut filter 52 like in the fifth embodiment. The terminal 511 is supplied with a voltage equivalent to the reference voltage B that is supplied to the resistor 212 of the voltage dividing circuit 21.

When the reference voltage B of the operational amplifier 31 is supplied to the terminal 511, the correcting circuit 51 supplies a voltage dividing output corresponding to a difference between the reference voltage A and the reference voltage B, to the high-cut filter 52. The output current from the correcting circuit 51 is supplied to the plus terminal of the operational amplifier 131 via the resistor 521, and is also accumulated in the capacitor 522. The capacitor 522 supplies the accumulated current to the plus terminal of the operational amplifier 131, thereby cutting the AC component from the output voltage from the correcting circuit 51. In other words, the reference voltage A of the operational amplifier 131 is corrected by the output voltage from the correcting circuit 51 so as to approximately coincide with the reference voltage B of the voltage dividing circuit 21.

As explained above, according to the sixth embodiment, the operational amplifier 131 has the correcting circuit 51 that corrects the difference between the reference voltage A of the operational amplifier 131 and the reference voltage B of the voltage dividing circuit 21. Therefore, high-quality voice communications can be provided by effectively using the dynamic range of the analog amplifier circuit, for example.

OTHER EMBODIMENTS

The present invention is not limited to the above embodiments. For example, in the first embodiment, an example of clipping the voice signal with the operational amplifier is explained. However, other amplifier than the operational amplifier can be used to clip the voice signal.

In the second and third embodiments, examples of using the voltage dividing circuit and the operational amplifier to set the clipped voice signal to below the input rated level of the processing section are explained. However, in addition to the voltage dividing circuit and the operational amplifier, a unit that can convert the clipped voice signal into a signal below the input rated level of the processing section can be used.

In the above embodiments, examples of application of the invention to the IP telephone sets are explained. However, the invention can also be applied to analog telephone sets and digital telephone sets in addition to the IP telephones. The above embodiments can also be applied to electronic devices that handle voice signals in addition to the telephone sets.

The kinds and configurations of the telephone set, the configuration of the voice signal clipping circuit within the voice input/output I/F, and the process of clipping the voice signal can also be modified within a range not deviating from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voice signal clipping circuit comprising:
   an amplifier which amplifies an input voice signal to a permissible level; and
   a clipper which clips an amplitude component larger than a value of a higher limit and an amplitude component smaller than a value of a lower limit from an output signal from the amplifier, the higher limit being set to a value close to an analog power source level of the amplifier and the lower limit being set to a value close to a ground level of the amplifier.

2. The voice signal clipping circuit according to claim 1, further comprising:
   a processor which processes a voice signal of an input level lower than the permissible level; and
   a converter which converts an output signal from the clipper into a signal of the input level of the processor.

3. The voice signal clipping circuit according to claim 2, wherein the converter comprises:
   a first resistor which is provided on a signal line to connect between the clipper and the processor; and
   a second resistor which connects between an output terminal of the first resistor and a reference potential point.

4. The voice signal clipping circuit according to claim 2, wherein the converter comprises:
   an attenuator which attenuates the output signal from the clipper to the input level of the processor.

5. The voice signal clipping circuit according to claim 2, further comprising:
   a corrector which corrects a reference voltage of the amplifier so as to approximately coincide with a reference voltage of the converter when the reference voltage of the amplifier and the reference voltage of the converter are different.

6. The voice signal clipping circuit according to claim 1, further comprising:
   a first remover which removes a higher signal component than an upper end of a voice band from an output signal from the clipper; and
   a second remover which removes a lower signal component than a lower end of the voice band from the output signal from the clipper.

7. A telephone set comprising:
- an amplifier which amplifies an input voice signal to a permissible level; and
- a clipper which clips an amplitude component larger than a value of a higher limit and an amplitude component smaller than a value of a lower limit from an output signal from the amplifier, the higher limit being set to a value close to an analog power source level of the amplifier and the lower limit being set to a value close to a ground level of the amplifier.

8. The telephone set according to claim 7, further comprising:
- a processor which processes a voice signal of an input level lower than the permissible level; and
- a converter which converts an output signal from the clipper into a signal of the input level of the processor.

9. The telephone set according to claim 8, wherein the converter comprises:
- a first resistor which is provided on a signal line to connect between the clipper and the processor; and
- a second resistor which connects between an output terminal of the first resistor and a reference potential point.

10. The telephone set according to claim 8, wherein the converter comprises:
- an attenuator which attenuates the output signal from the clipper to the input level of the processor.

11. The telephone set according to claim 8, further comprising:
- a corrector which corrects a reference voltage of the amplifier so as to approximately coincide with a reference voltage of the converter when the reference voltage of the amplifier and the reference voltage of the converter are different.

12. The telephone set according to claim 7, further comprising:
- a first remover which removes a higher signal component than an upper end of a voice band from an output signal from the clipper; and
- a second remover which removes a lower signal component than a lower end of the voice band from the output signal from the clipper.

* * * * *